United States Patent [19]

Lisco

[11] Patent Number: 4,571,506

[45] Date of Patent: Feb. 18, 1986

[54] LED DRIVER CIRCUIT

[75] Inventor: Richard J. Lisco, Whippany, N.J.

[73] Assignee: AT&T Bell Laboratories, Murray Hill, N.J.

[21] Appl. No.: 594,219

[22] Filed: Mar. 28, 1984

[51] Int. Cl.[4] ........................... H03K 3/01; H03K 3/33
[52] U.S. Cl. .................................... 307/311; 307/270; 307/300; 307/297
[58] Field of Search ............... 307/311, 310, 300, 317, 307/254, 297

[56] References Cited

U.S. PATENT DOCUMENTS

| | | | |
|---|---|---|---|
| 3,968,399 | 7/1976 | Jarett | 315/200 R |
| 4,425,515 | 1/1984 | Larson | 307/319 |
| 4,485,311 | 11/1984 | Goerne et al. | 307/311 |

Primary Examiner—Stanley D. Miller
Assistant Examiner—B. P. Davis
Attorney, Agent, or Firm—John K. Mullarney; Patrick E. Roberts

[57] ABSTRACT

A driver circuit turns an LED 'on' and 'off' in response to input logic 'one' and 'zero' data signals. A current regulator 11 is series coupled with the LED and serves to maintain a constant current to the LED over time, temperature, and supply voltage variations. During turn-off, this current is shunted away from the LED by a low impedance emitter follower (Q3), operated in the active non-saturated region, and a small reverse bias potential is momentarily applied to the LED which quickly sweeps out the charge stored in the LED junction. At the end of the 'off' cycle there is a forward prebias potential across the LED. During turn-on, the current shunt is reverse biased and a current peaking circuit (14) provides a momentary additional current through the LED. This instantaneous forward current peaking and the forward prebias both serve to substantially reduce the turn-on delay and rise time of the optical drive signal. The current peaking and current shunting circuits are driven from the same differential amplifier (Q1 and Q2).

7 Claims, 3 Drawing Figures

LED DRIVER CIRCUIT

TECHNICAL FIELD

The present invention relates to fiber optic communications systems and, more particularly, to a high bit rate LED driver for optical transmitters.

BACKGROUND OF THE INVENTION

Light-Emitting Diodes (LEDs) are proven reliable light sources in fiber optic communications systesm. LEDs have substantially longer operating lifetimes than lasers. Conversely, lasers emit more optical power and are capable of higher modulation rates. The slower switching speeds of present high-radiance LEDs restrict these devices to applications requiring low to moderate data rates in the order of 50 Mbits. The LED modulation bandwidth determines the maximum achievable data rate. The modulation bandwidth is inversely related to optical power, and controlled by the doping density of the semiconductor material. In the fabrication process, optical power is often traded for speed to obtain high-speed devices for high bit-rate LED based communication systems.

It is a primary objective of the present invention to achieve higher data rates from the same LED(s) without sacrificing optical power.

A related object is to enhance the optical switching times of an LED and thereby effectively increase the LED speed-power product.

An LED driver circuit in accordance with the present invention enhances optical switching times by conditioning the drive pulse to the LED. The driver has fast turn-on and turn-off capabilities enabling an LED to be operated at high data ratrs (e.g., >300 Mbits). A current regulator is series coupled with the LED and serves to maintain a constant current to the LED over time, temperature, and supply voltage variations. During turn-off, this current is shunted away from the LED by a low impedance emitter follower, operated in the active non-saturated region, and a small reverse bias potential is momentarily supplied to the LED which quickly sweeps out the charge stored in the LED junction. At the end of the "off" cycle there is a forward prebias potential across the LED. During turn-on, the current shunt is reverse biased and a current peaking circuit provides a momentary additional current through the LED. This instantaneous forward current peaking and the forward prebias both serve to substantially reduce the turn-on delay and rise time of the optical drive signal. The current peaking and current shunting circuits are driven from the same differential amplifier, which minimizes timing errors. Also, by driving both LED turn-on and turn-off circuits from one source, improper sequencing of current peaking and current shunting resulting from variations in propagation delays is minimized.

BRIEF DESCRIPTION OF THE DRAWINGS

The invention will be more fully appreciated from the following detailed description when the same is considered in connection with the accompanying drawings in which.

DETAILED DESCRIPTION

The high-speed LED driver to be described herein increases the switching speed of an LED by tailoring the drive signal. This is achieved through effective implementation of the following features: instantaneous forward current peaking and a prebias voltage reduce the turn-on delay and rise time; and, a low impedance shunt switch and charge remover reduce turn-off delay and fall time.

Figure 1:
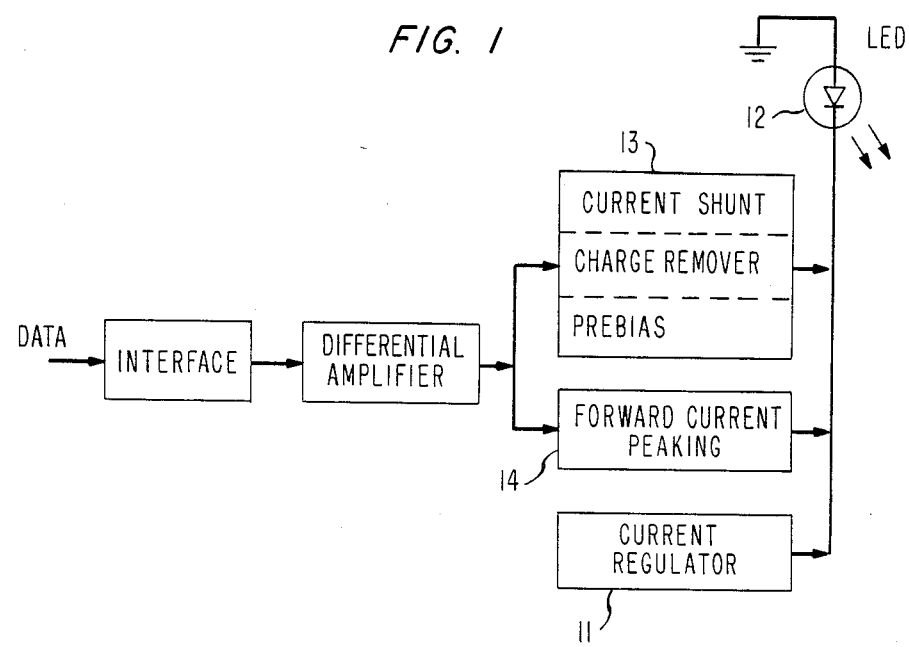
FIG. 1 is a functional block diagram of a high bit rate LED driver in accordance with the present invention.

The functional block diagram of the LED driver is shown in FIG. 1. A precision current regulator 11 provides a constant current to the LED 12 over time, temperature and supply voltage variations. The LED may comprise any of the standard state-of-the-art devices, such as the Western Electric ® 601B LED. When the data input is a logic 'one' the regulator current flows through the LED and the optical signal is transmitted. When the data input is at a logic 'zero', the regulator current is diverted from the LED into a high-speed non-saturating current shunt, and the optical signal ceases. Removing all of the current from the LED IN THE 'off' state produces the best possible extinction ratio.

In the transition from a logic 'one' to 'zero', the current-shunt/charge-remover 13 quickly shunts the forward current away from the LED and further supplies a small reverse bias potential ($\approx 0.2$ Vdc) to the LED. This is the maximum allowed reverse voltage for the 601B LED. The result is a high reverse current which quickly sweeps out the charge stored in the LED junction. The magnitude of the reverse current is limited by the bulk resistance of the LED and the shunt circuit resistance. The applied reverse voltage decays exponentially in a time interval less than the period of the data, but long enough to insure that the minority carrier charge is depleted. At the end of the exponential decay the voltage across the LED is approximately-0.45 Vdc. This is the forward prebias potential present prior to the 'off' to 'on' transition. This completes the 'off' cycle.

In the transition from a logic 'zero' to 'one', the current-shunt is removed and the forward current peaking circuit 14 supplies an instantaneous current ($\approx 50$ mA peak) which adds to the current supplied bu the precision current regulator (e.g., 150 mA). The prebias potential and the current peaking combine to reduce the voltage excursion across, and to increase the current through, the LED. Both the prebias and the current peaking serve to decrease the time required to charge the large LED junction capacitance. The net effect is a reduction in the turn-on delay and rise time of the optical signal. The peaking current decays exponentially in a time less than the data period. The steady state current at the end of the exponential decay is maintained at 150 mA by the precision current regulator. This completes the 'on' cycle.

The time constants controlling the current peaking and charge removal can be optimized for any data rate by charging passive circuit elements. In general, higher reverse potentials would result in a further reduction in turn-off delay and fall time. However, the maximum peak reverse voltage is restricted by the breakdown characteristics of the LED.

Figure 2:
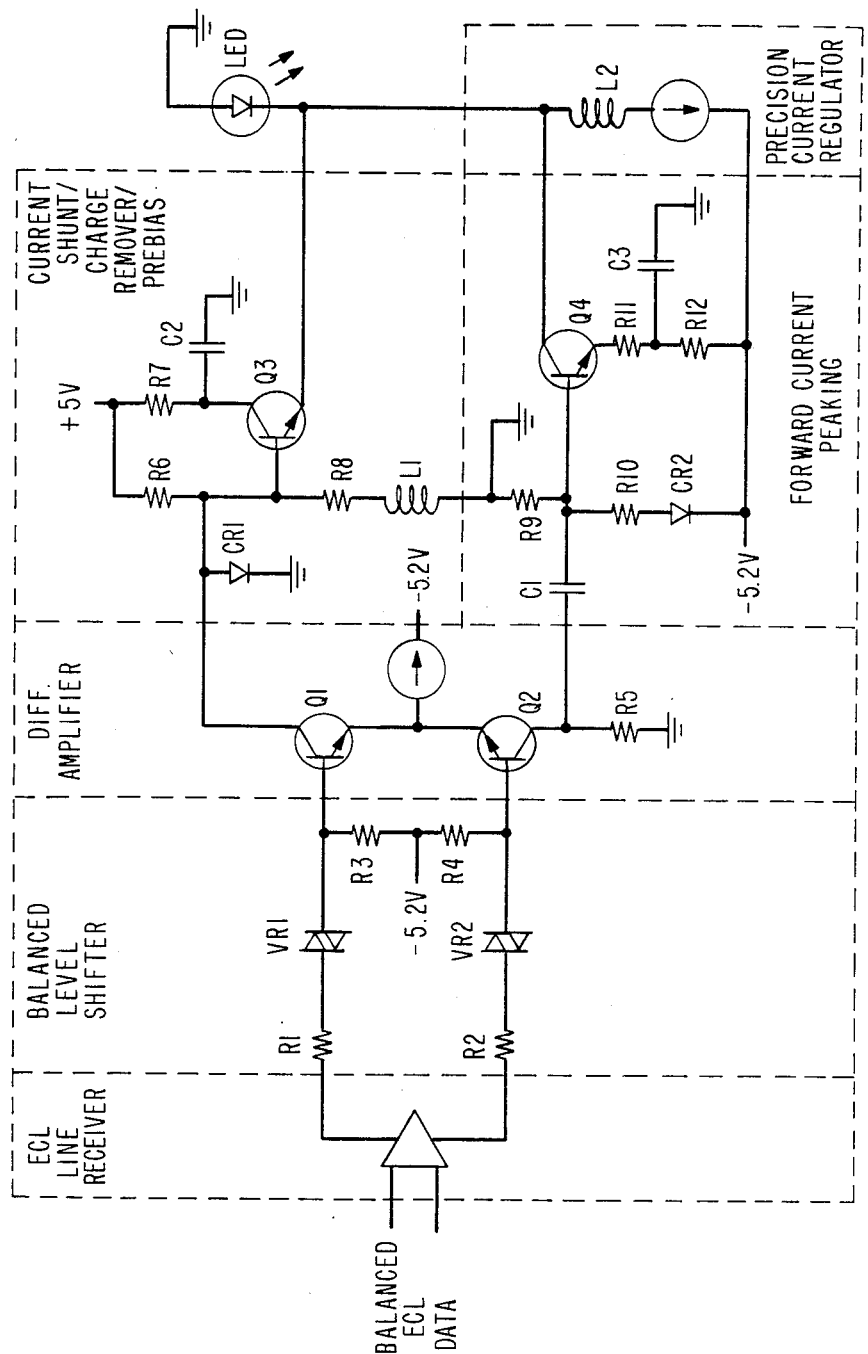
FIG. 2 is a schematic diagram of the driver circuit.

Referring now to FIG. 2, the precision current regulator is a high performance current source implemented in a straightforward fashion with opertional amplifiers and an integrated voltage reference. The regulator maintains a constant current to the LED over time, temperature, and supply voltage variations. A low Q inductive element L2 is used for compensation purposes to maintain a high output impedance at higher frequencies.

For purposes of explanation, it shall be assumed that the data input to the driver circuit is conventional balanced ECL (emitter coupled logic). The ECL line receiver is of conventional design, offering a wide input common-mode voltage range and low output impedance so as to provide a good interface between the external data source and the driver circuit.

Level shifting between the ECL line receiver and the differential amplifier assures a full 2 volt swing at the output of the differential amplifier without saturation of the amplifier transistors. The passive balanced level shifter is composed of resistors R1, R2, R3, and R4, and varistors VR1 and VR2. Series damping resistors R1 and R2 minimize ringing on the drive signal to the differential amplifier. Varistors VR1 and VR2 consist of four diode elements connected in a series parallel arrangement. Low dynamic resistance and high junction capacitance make these varistors excellent low loss level shifting elements. Terminating resistors R3 and R4 also serve as pull-down resistors for the outputs of the ECL line receiver.

A single differential amplifier, comprised of transistors Q1 and Q2, provides voltage gain and complementary output signals which drive the LED current shunting and current peaking circuits. The wide-band differential amplifier, formed by two matched gigahertz transistors, is biased by a constant current source. The bias current is selected to maximize the gain-bandwidth product of the differential stage. Overdriving the inputs to the differential produces rise and fall times twice as fast as the ECL driving gate. The output signal swing at the collector of Q1 is 2 volts peak-to-peak, with rise and fall times of one nanosecond, this corresponding to a 3 dB bandwidth of 350 MHz.

The current shunt, charge remover and prebias functions are performed by a single high-speed, non-saturating switch and a few passive components. In the steady-state condition when the data input is at logic "one" the current shunt (Q3) is "off", and all of the current flows through the LED into the precision current regulator. In this state Q1 is conducting, and the collector current of Q1 flowing through R6 and R8 produces a negative bias voltage at the base of Q3 which maintains Q3 off. Note that the same steady-state current flowing through R8 also flows through L 1 which is in series with R8. Because of the ratio of these resistors, about 90% of Q1's collector current flows through the combination of R8 and L1. The stored energy in L1 is used to produce the reverse bias across the LED during turn-off to remove the stored charge.

In the transition from a logic 'one' to 'zero', Q1 passes from a conducting to a non-conducting state. Now, because of the energy storage element L1, the current that was flowing from L1 into Q1, now flows into clamp diode CR1. This current flow into CR1 produces a positive voltage at the base of Q3 of approximately 0.9 volts. The resultant emitter voltage of Q3, which is tied to the cathode of the LED, is 0.2 volts dc. With the anode of the LED at ground potential, this represents a two tenths of a volt reverse bias across the LED. The maximum reverse potential is limited by clamp diode CR1. Because the source of this potential is the output of a low impedance emitter follower, the maximum reverse current through the LED is limited primarily by the bulk resistance of the LED. The magnitude of reverse current is the reverse voltage minus the actual voltage across the PN junction ($V_j$) divided by the LED bulk resistance. For an LED with a bulk resistance of 5 ohms, and $V_h$ of $-0.8$ Vdc the resulting peak reverse current would be $(0.2-(-0.8))/5=200$ mA. The reverse current will decrease rapidly as the minority carrier charge stored in LED junction is removed.

The reverse bias decays exponentially to the prebias potential (31 0.45 Vdc) in a time interval controlled by aL1 and the equivalent circuit resistance ($\tau = $ L Req.). The time constant is chosen such that the prebias voltage would reach 95% of its steady-state value in a time interval less than the data period.

The potential present at the cathode of the LED at the end of the "off" cycle is the prebias voltage across the LED. The magnitude of the prebias potential is equal to the steady-state voltage at the base of Q3 minus Vbe "on". The base voltage of Q3 (0.35 Vdc) is determined by resistive voltage divider R6, R8 and diode CR1. Vbe "on" is assumed to be 0.8 Vdc. The resultant prebias potnetial is $-0.45$ Vdc ($0.35-0.8=0.45$ Vdc). Since this forward bias voltage is less than the cut-in potential of the LED, only a small leakage current flows and no optical output is produced. In this steady-state condition where the LED is 'off', the current shunt Q3 provides current to the precision current regulator.

The prebias potential serves to reduce the turn-on time of the LED by maintaining a charge on the junction capacitance of the LED.

In the transition form a logic 'zero' to 'one' the current shunt is removed and the current peaking circuit supplies an additional 50 mA peak instantaneous forward current to the LED. At this instant the total current through the LED is the sum of the currents supplied by the current peaking circuit and the precision current regulator, or 200 mA.

In the transition from a logic 'zero' to a 'one', Q2 passes from a conducting to a non-conducting state. The resultant positive voltage step is differentiated by capacitor C1 and resistors R9 and R10 and passed to the base of the common emitter current peaking switch (Q4). The differentiated positive voltage pulse increases the collector current of Q4 from 5 to 50 mA at the instant the current shunt Q3 turns-off. Because the current through the LED is the sum of the collector current of Q4 and the precision regulator current, the instantaneous LED current during turn-on is 200 mA. The combination of the prebias potential and the current peaking both serve to reduce the turn-on delay and rise time of the optical signal. Resistors R9, R10, R11 and R12 along with diode CR2 set the quiescent collector current of Q4($\approx 5$ MA) and stablize the operating current over the operating temperature range. Emitter resistors R11 provides ac stability. Maintaining a steady-state current through Q4 iliminates the turn-on delay in the device, thereby insuring accurate timing of the peaking current and the shunt switch.

Figure 3:
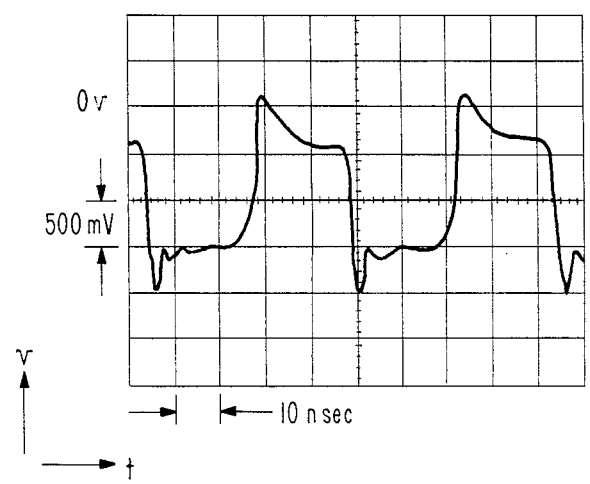
FIG. 3 shows a typical drive pulse that is outputted by the driver circuit of FIG. 2.

FIG. 3 illustrates a drive pulse outputted by the driver circuit of the invention. The vertical divisions represent 500 mv/division, and the horizontal are 10 nS/division. The drive signal is a balanced ECL 45 Mbit, NRZ, alternating 1/0 data pattern. As indicated, the maximum negative voltage is $-2.0$ volts which corresponds to a peak instantaneous forward current of 200 mA. The duration of the peak current is $<3$ ns.

After a few nanoseconds settling time the forward current drops to the steady-state current of 150 mA which is maintained by the precision current regulator for the duration of the data 'on' period. The electrical rise and fall times are 1.4 and 1.2 ns, respectively.

The various voltage and current values recited in the specification and shown in the drawings are only by way of example and it should be clear that the invention is in no way limited thereto. Similarly, the transistor types shown in the drawing are merely by way of illustration, it being clear to those in the art that p-n-p transistors can generally be substituted for n-p-n transistors and vice versa with due regard, of course, to the polarities of the direct current potential sources. It is to be understood therefore that the foregoing disclosure relates to only a preferred embodiment of the invention and that numerous modifications or alterations may be made therein without departing from the spirit and scope of the invention.

What is claimed is:

1. A driver circuit for turning an LED on and off in response to input logic one and zero data signals comprising a current regulator series coupled with the LED for maintaining a constant current to the LED, means responsive to an input logic "zero" signal for shunting said current away from the LED and applying for a short time interval a peak reverse bias to the LED, and means responsive to an input logic one signal for removing the current shunt and applying for a short time interval a peak forward current to the LED,
    said current shunting means providing a forward prebias potential to the LED at the end of the first recited short time interval.

2. A driver circuit as defined in claim 1 wherein said short time intervals are less than the period of the data signals.

3. A driver circuit as defined in claim 2 wherein the current shunting means and the current peaking means are operative in response to complementary output signals from a differential amplifier.

4. A driver circuit as defined in claim 3 wherein the current shunting means comprises a low impedance emitter follower operated in the active non-saturated region.

5. A driver circuit as defined in claim 4 wherein the emitter of said emitter follower is connected to the cathode of the LED.

6. A driver circuit as defined in claim 3 wherein the current peaking means comprises a common emitter transistor amplifier.

7. A driver circuit as defined in claim 6 wherein the collector of said common emitter transistor is connected to the cathode of the LED.

* * * * *